(12) United States Patent
Kabe et al.

(10) Patent No.: US 12,328,518 B2
(45) Date of Patent: Jun. 10, 2025

(54) LIGHT DETECTOR

(71) Applicant: Panasonic Intellectual Property Management Co., Ltd., Osaka (JP)

(72) Inventors: Tatsuya Kabe, Osaka (JP); Hideyuki Arai, Osaka (JP); Hisashi Aikawa, Osaka (JP); Yuki Sugiura, Osaka (JP); Akito Inoue, Osaka (JP); Mitsuyoshi Mori, Kyoto (JP); Kentaro Nakanishi, Nara (JP); Yusuke Sakata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/541,932

(22) Filed: Dec. 15, 2023

(65) Prior Publication Data

US 2024/0121530 A1 Apr. 11, 2024

Related U.S. Application Data

(63) Continuation of application No. 17/486,495, filed on Sep. 27, 2021, now Pat. No. 11,889,215, which is a
(Continued)

(30) Foreign Application Priority Data

Mar. 28, 2019 (JP) ................................ 2019-063298

(51) Int. Cl.
*H04N 25/75* (2023.01)
*H04N 25/766* (2023.01)
(Continued)

(52) U.S. Cl.
CPC ........... *H04N 25/75* (2023.01); *H04N 25/766* (2023.01); *H10F 39/18* (2025.01); *H10F 39/8037* (2025.01); *H10F 39/811* (2025.01)

(58) Field of Classification Search
CPC ............................ H04N 25/75; H04N 25/766; H01L 27/14612; H01L 27/14636;
(Continued)

(56) References Cited

U.S. PATENT DOCUMENTS

2009/0261441 A1* 10/2009 Yasukawa ............. H01L 31/103
257/438
2013/0193546 A1 8/2013 Webster et al.
(Continued)

FOREIGN PATENT DOCUMENTS

JP 2017-005276 A 1/2017

OTHER PUBLICATIONS

International Search Report and Written Opinion issued in International Patent Application No. PCT/JP2020/010235, dated Jun. 16, 2020; with partial English translation.
(Continued)

*Primary Examiner* — Shahbaz Nazrul
(74) *Attorney, Agent, or Firm* — Rimon P.C.

(57) ABSTRACT

A light detector is configured such that a light receiving portion having APDs and a peripheral portion are provided on a first principal surface of a p-type semiconductor substrate, and further includes a back electrode provided on a second principal surface of the semiconductor substrate and a p-type first separation portion provided between the light receiving portion and the peripheral portion. The APD has, on a first principal surface side, an n-type region and a p-epitaxial layer contacting the n-type region in a Z-direction. The peripheral portion has an n-type MISFET provided at a p-well and an n-well provided to surround entire side and bottom portions of the p-well.

11 Claims, 9 Drawing Sheets

Related U.S. Application Data continuation of application No. PCT/JP2020/010235, filed on Mar. 10, 2020.

(51) Int. Cl.
*H10F 39/00* (2025.01)
*H10F 39/18* (2025.01)

(58) Field of Classification Search
CPC . H01L 27/14643; H01L 31/107; H10F 39/18; H10F 39/8037; H10F 39/811; H10F 39/024; H10D 84/80; A23B 99/00
See application file for complete search history.

(56) References Cited

U.S. PATENT DOCUMENTS

| | | | |
|---|---|---|---|
| 2016/0295147 A1* | 10/2016 | Tashiro | H04N 25/78 |
| 2017/0031010 A1* | 2/2017 | Suzuki | H01L 27/14629 |
| 2021/0293967 A1 | 9/2021 | Fujiwara et al. | |
| 2022/0302184 A1 | 9/2022 | Finkelstein | |

OTHER PUBLICATIONS

Notice of Allowance dated Sep. 18, 2023 issued in U.S. Appl. No. 17/486,495.

* cited by examiner

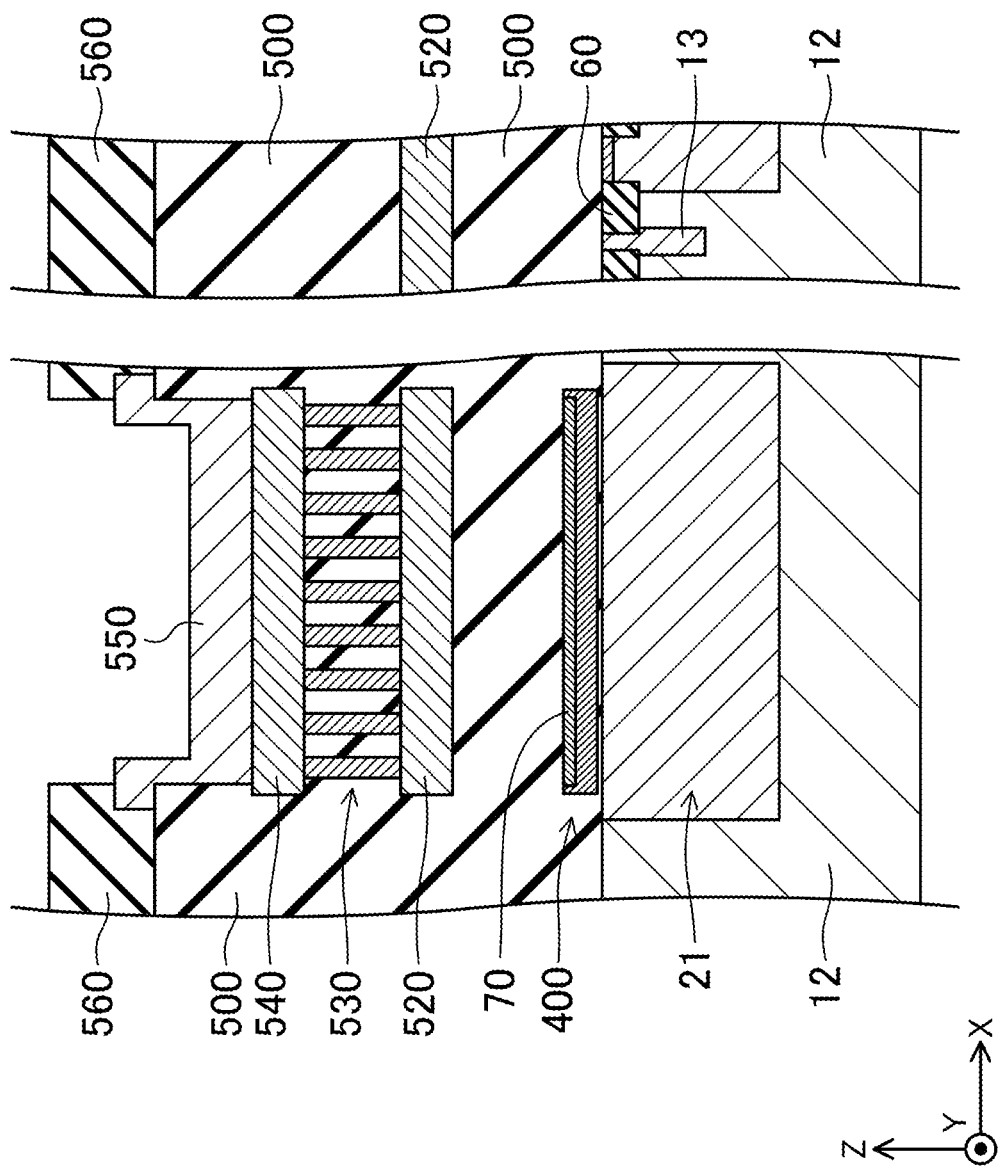

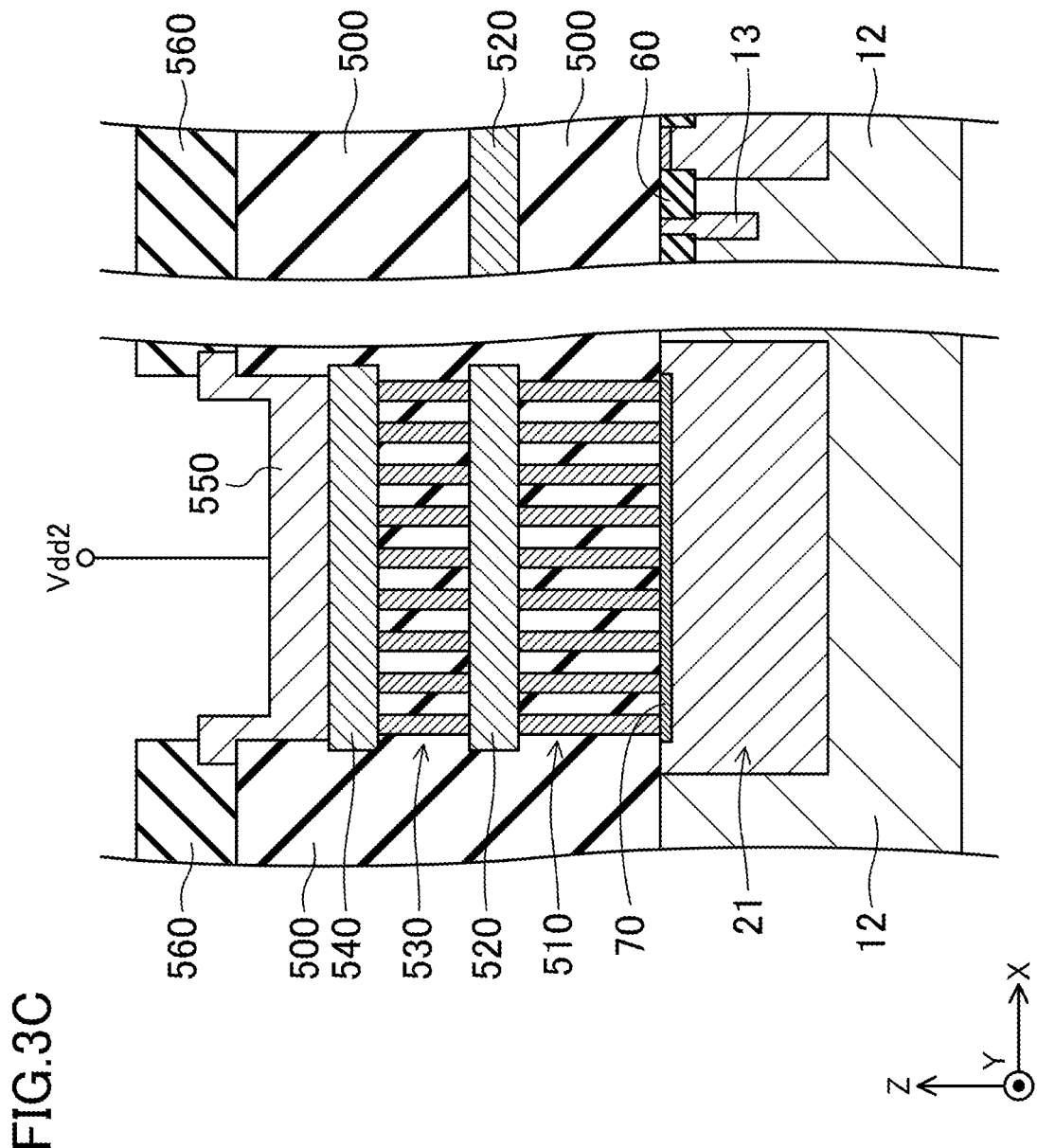

LIGHT DETECTOR

CROSS-REFERENCE TO RELATED APPLICATIONS

This is a Continuation of U.S. patent application Ser. No. 17/486,495, filed on Sep. 27, 2021, which is a Continuation of International Application No. PCT/JP2020/010235, filed on Mar. 10, 2020, which claims priority to Japanese Patent Application No. 2019-063298, filed on Mar. 28, 2019. The entire disclosures of these applications are incorporated by reference herein.

BACKGROUND

The present disclosure relates to a light detector, and particularly relates to a light detector including avalanche photodiodes.

In recent years, in a wide variety of fields such as medical treatment, communication, biology, chemistry, monitoring, vehicle installation, and radiation detection, a highly-sensitive light detector has been utilized. As one technique for sensitivity enhancement, an avalanche photodiode (hereinafter referred to as an "APD") has been used. The APD is a photodiode configured to multiply a signal charge, which is generated by photoelectric conversion of light having entered a photoelectric conversion layer, by means of avalanche breakdown to enhance light detection sensitivity. With the APD, even a slight number of photons can be detected.

Japanese Unexamined Patent Publication No. 2017-005276 discloses an APD array having a separation region between adjacent APDs.

Such a separation region includes a p-type semiconductor layer extending inward of a principal surface of a semiconductor substrate, and the potential of the p-type semiconductor layer is the same as that of the semiconductor substrate, i.e., a ground potential (hereinafter referred to as a GND potential). Moreover, an n-type field-effect transistor (hereinafter referred to as an n-type MISFET) is provided inside the p-type semiconductor layer. Further, an n-type well is formed in a region of the p-type semiconductor layer or a region between the APDs, and in such an n-type well, a p-type field-effect transistor (hereinafter referred to as a p-type MISFET) is provided.

In a light detector configured such that a light receiving portion formed with APDs and a peripheral circuit portion configured to exchange a signal with the light receiving portion are formed on the same semiconductor substrate, a configuration in which the layout of the peripheral circuit portion can be freely set has been demanded for enhancing the degree of freedom in circuit design.

However, the typical configuration disclosed in Japanese Unexamined Patent Publication No. 2017-005276 fails to provide the technique of arranging a CMOS circuit and other circuits outside the APD array in optional layout.

The present disclosure has been made in view of the above-described point, and an object of the present disclosure is to provide a light receiving portion configured such that a light receiving portion having one or more avalanche photodiodes and a peripheral circuit portion configured to exchange a signal with the light receiving portion are provided on a principal surface of the same semiconductor substrate and configured so that the degree of freedom in the layout of the peripheral circuit portion can be enhanced.

SUMMARY

For accomplishing the above-described object, the light detector according to the present disclosure is a light detector in which a light receiving portion and a peripheral portion are provided on a semiconductor substrate. The light receiving portion includes: an n-type first region; a p-type second semiconductor layer; and a p-type first semiconductor layer. The first region, the second semiconductor layer, and the first semiconductor layer are stacked in this order. A maximum p-type impurity concentration in the first semiconductor layer is higher than a maximum p-type impurity concentration in the second semiconductor layer. The peripheral portion includes: a p-type first well; an n-type third well; and the first semiconductor layer. The third well surrounds entire side and bottom portions of the first well as viewed in a section. According to the light detector of the present disclosure, the light receiving portion and the peripheral circuit portion can be electrically separated from each other, and the layout of the peripheral circuit portion relative to the light receiving portion can be freely changed.

BRIEF DESCRIPTION OF THE DRAWINGS

FIG. 3B is a schematic sectional view along an IIIB-IIIB line of FIG. 1.

FIG. 3C is a schematic sectional view along an IIIC-IIIC line of FIG. 1.

DETAILED DESCRIPTION

Hereinafter, an embodiment of the present disclosure will be described in detail with reference to the drawings. Description of the preferred embodiment below is merely illustrative in nature, and is not intended to limit the present disclosure and applications or uses thereof.

Embodiment

[Configuration of Light Detector]

Figure 1:
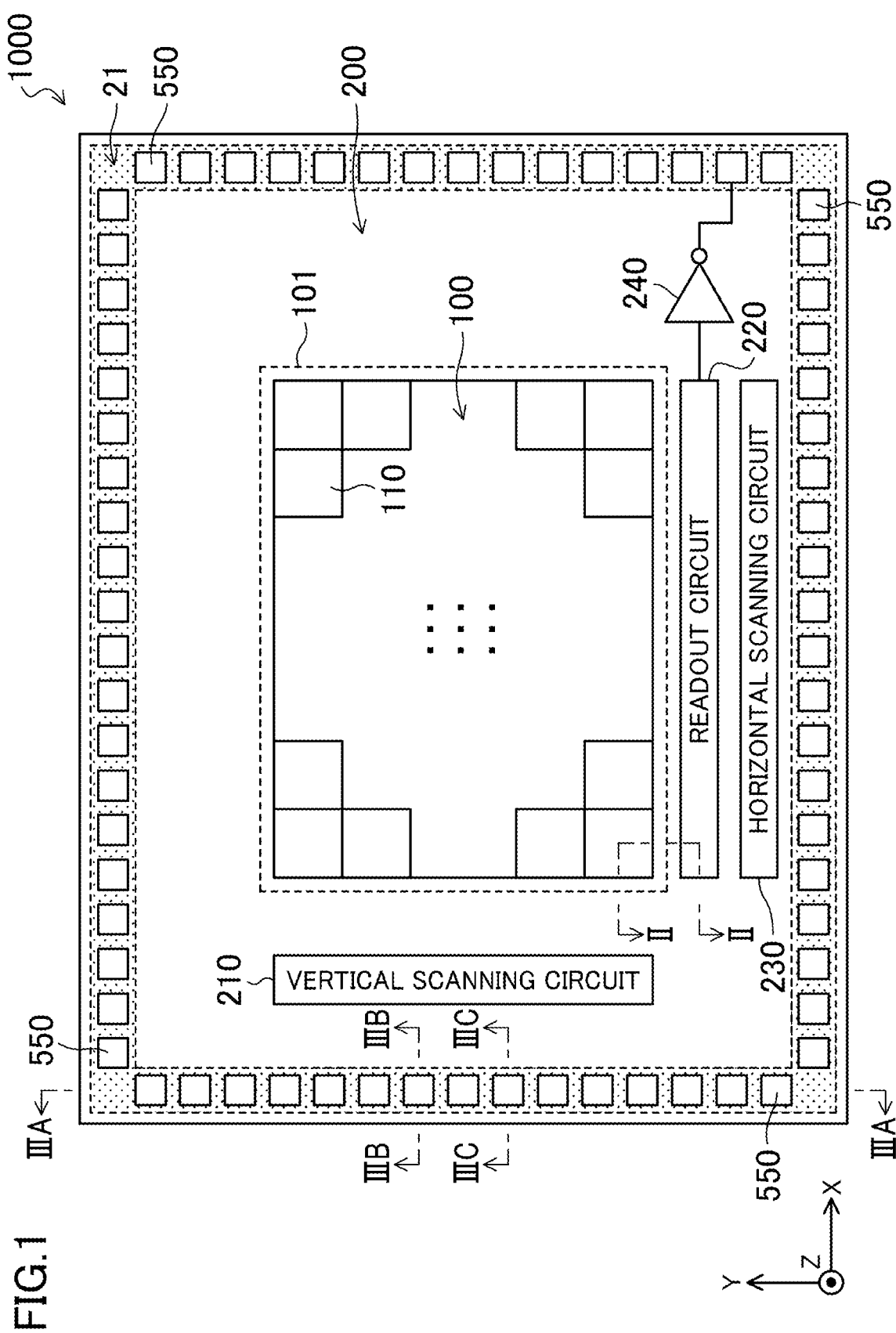
FIG. 1 is a schematic plan view of a light detector according to one embodiment.
Figure 2:
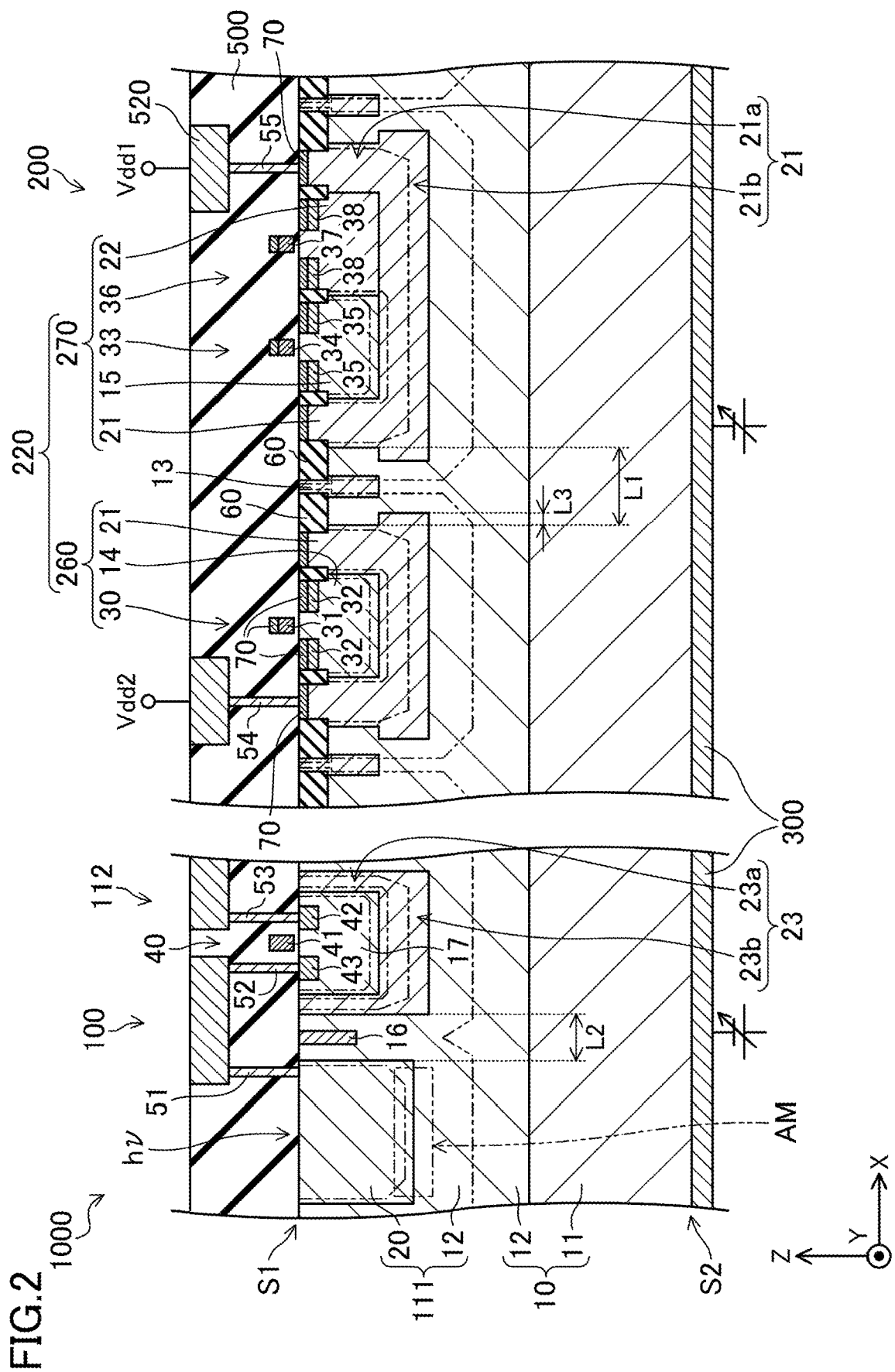
FIG. 2 is a schematic sectional view along an II-II line of FIG. 1.

FIG. 1 shows a plan view of a light detector according to the present embodiment, and FIG. 2 shows a schematic sectional view along an II-II line of FIG. 1. Note that for the sake of convenience in description, a circuit configuration in a pixel 110 and a connection relationship between a light receiving portion 100 and a peripheral circuit portion 200 are not shown in the figure. Moreover, FIG. 2 shows only part of the peripheral circuit portion 200. Further, a contact and a wire connected to a transistor in the peripheral circuit portion 200 are not shown in the figure, and description thereof will be omitted.

Note that in the light detector 1000, a side on which a wire (hereinafter referred to as a first wiring layer 520) in a first layer is provided will be sometimes referred to as an upper side and a side on which a back electrode 300 is provided will be sometimes referred to as a lower side. FIG. 2 does not show a wiring layer and an insulating layer positioned on the upper side with respect to the first wiring layer 520, and description of these layers will be omitted.

As shown in FIG. 1, the light detector 1000 includes the light receiving portion 100 and the peripheral circuit portion 200, and these portions are provided on a first principal surface S1 of a p-type semiconductor substrate 10 (hereinafter sometimes merely referred to as a substrate 10) (see FIG. 2). Note that in the present embodiment, the substrate 10 is made of single-crystal silicon.

In description below, a row direction of the pixels 110 in FIG. 1 will be sometimes referred to as an X-direction, and a column direction of the pixels 110 will be sometimes referred to as a Y-direction. Moreover, a direction perpendicular to each of the X-direction and the Y-direction, i.e., a depth direction of the substrate 10 in this case, will be sometimes referred to as a Z-direction.

A plurality of pad electrodes 550 is provided at predetermined intervals at the periphery of the light detector 1000, and power-supply voltage supplied to the light receiving portion 100 and the peripheral circuit portion 200 is supplied from the outside through a predetermined pad electrode 550. Note that a later-described n-well 21 is continuously formed on a first principal surface S1 side of the substrate 10 positioned on the lower side of the pad electrode 550 and is electrically connected to a power supply of a predetermined voltage Vdd2 through the pad electrode 550.

The light receiving portion 100 is a so-called pixel array in which the pixels 110 are arrayed in a matrix at predetermined intervals, and the position of a peripheral edge (hereinafter sometimes referred to as a pixel array end 101) of the light receiving portion 100 is determined within the first principal surface S1. Moreover, the size of the pixel 110 and an interval between adjacent pixels 110 are also fixed. That is, the light receiving portion 100 is configured as a pixel array whose layout is fixed. On the other hand, the layout of the peripheral circuit portion 200 of the present embodiment can be freely changed. This will be described later.

As described in detail later, the pixel 110 has an APD 111 and a pixel circuit portion 112 electrically connected to the APD 111 to read a signal charge generated at the APD 111.

The peripheral circuit portion 200 is arranged at the periphery of the light receiving portion 100, and has a vertical scanning circuit 210, a horizontal scanning circuit 230, a readout circuit 220, and a buffer amplifier 240. As described above, the peripheral circuit portion 200 may include a circuit other than above. For example, in a case where a column analog-digital converter (not shown in the figure, and hereinafter sometimes referred to as a column ADC) is provided in the readout circuit 220, a digital-analog converter (not shown in the figure) may be provided at the peripheral circuit portion 200.

The vertical scanning circuit 210 operates pixel circuit portions 112 of a selected row to output signal charges generated at APDs 111 of such a row to the readout circuit 220 through not-shown vertical signal lines. The readout circuit 220 is a circuit configured to remove a noise component contained in the input signal charge or convert the signal charge as an analog signal into a digital signal. The signal transferred to the readout circuit 220 is transferred to the buffer amplifier 240 by drive of the horizontal scanning circuit 230, and is output to a not-shown signal processing circuit at a subsequent stage. After having been subjected to signal processing such as white balance in the signal processing circuit, the signal is transferred to a display (not shown in the figure), a memory (not shown in the figure), etc., and light received by the light receiving portion 100 is, for example, converted into an image.

An image is captured while a voltage to be applied to the back electrode 300 is switched for each frame, and these images are synthesized so that a video with a wide dynamic range can be captured.

Next, the structures of the pixel 110 and the peripheral circuit portion 200 will be further described.

As shown in FIG. 2, the substrate 10 includes a p-type semiconductor layer (a first semiconductor layer) 11 and a p-epitaxial layer (a second semiconductor layer) 12 stacked on the p-type semiconductor layer 11, and the back electrode 300 is provided across the entirety of a second principal surface S2 of the substrate 10. A p-type impurity concentration in the p-epitaxial layer 12 is about $1\times10^{16}$ cm$^{-3}$. Note that the concentration is not limited to above and the value thereof may be changed as necessary. Moreover, a p-type impurity concentration in the p-type semiconductor layer 11 is higher than that of the p-epitaxial layer 12. Particularly, in the vicinity of the second principal surface S2, such a concentration that the second principal surface S2 can be in ohmic contact with the back electrode 300, such as about $1\times10^{18}$ cm$^{-3}$ is preferred.

The APD 111 includes an n-type region (a first region) 20 provided to extend inward of the substrate 10 from the first principal surface S1 and the p-epitaxial layer (a second region) 12 positioned on the lower side of the n-type region 20. An n-type impurity concentration in the n-type region 20 is set to about $5\times10^{16}$ cm$^{-3}$ to about $1\times10^{19}$ cm$^{-3}$.

By application of negative voltage to the back electrode 300, a pn junction formed at an interface between the n-type region 20 and the p-epitaxial layer 12 is brought into a reverse bias state, and a multiplication region AM is formed. The multiplication region AM is a region where a charge generated by photoelectric conversion of received light (hv shown in FIG. 2) is multiplied by avalanche multiplication.

When electrons generated by photoelectric conversion in the p-epitaxial layer 12 positioned on the lower side of the multiplication region AM reach the multiplication region AM by drift, a carrier number is multiplied by 1 to 100,000 by avalanche multiplication. At this point, electrons generated by avalanche multiplication are accumulated in the n-type region 20. Moreover, holes generated at the same time as generation of the electrons are drifted to the back electrode 300, and are discharged to the outside of the light detector 1000, i.e., the outside of the substrate 10, through the back electrode 300.

Accordingly, holes not utilized as signals are discharged to the outside of the light detector 1000 in a short period of time so that time variation in voltage and spatial non-uniformity in the light detector 1000 can be reduced. Thus, a light detection efficiency is improved.

The pixel circuit portion 112 is arranged with a predetermined interval L2 from the APD 111 in the X-direction, and has a p-well (a fourth well) 17 provided to extend inward of the substrate 10 from the first principal surface S1, an n-well (a fifth well) 23 provided to surround side and bottom portions of the p-well 17, and a n-type MISFET (a third transistor) provided at the p-well 17.

The n-well 23 is formed at the substrate 10 such that a depth from the first principal surface S1 is equal to or greater than that of the n-type region 20. Note that the depth of the n-type region 20 is set to about 2 μm. Moreover, the n-well 23 has different n-type impurity concentrations between a portion (hereinafter sometimes referred to as a side portion 23a of the n-well 23) surrounding the side portion of the p-well 17 and a portion (hereinafter sometimes referred to as a bottom portion 23b of the n-well 23) extending inward of the substrate 10 in contact with the bottom portion of the p-well 17, and the n-type impurity concentration in the side portion 23a of the n-well 23 is higher than the n-type impurity concentration in the bottom portion 23b. Note that various methods for changing the impurity concentration between the side portion 23a and the bottom portion 23b of the n-well 23 have been known. For example, an n-type impurity may be ion-implanted into the entire region of the n-well 23 by means of a not-shown resist mask, and may be additionally implanted into a region corresponding to the side portion 23a of the n-well 23 by means of another resist mask. Alternatively, phosphorus may be implanted into the substrate 10 and arsenic may be implanted into the first principal surface S1 side by means of the same resist mask, and these substances may be thermally diffused to form the n-well 23. In this case, the coefficient of thermal diffusion of phosphorus is higher than that of arsenic, and for this reason, an impurity profile becomes moderate and a field intensity near the bottom portion 23b decreases. Note that through a not-shown contact, the n-well 23 is fixed to a predetermined potential such as Vdd2 (=3.3 V).

The n-type MISFET 40 has at least an n-type source 42 and a drain 43 provided at the first principal surface S1 and a gate 41 provided between the n-type source 42 and the drain 43 at the first principal surface S1 through a gate insulating layer (not shown in the figure) provided on the first principal surface S1.

The n-type region 20 is electrically connected to the drain 43 of the n-type MISFET through a first contact 51, the first wiring layer 520, and a second contact 52, and the n-type source 42 of the n-type MISFET 40 is electrically connected to a first circuit block 260 of the readout circuit 220 through a third contact 53 and the first wiring layer 520. Electrons accumulated in the n-type region 20 are transferred to the readout circuit 220 (see FIG. 1) in such a manner that the n-type MISFET 40 is turned on, and the light detector 1000 detects light having entered the light receiving portion 100 and outputs an electric signal.

A p-type second separation portion 16 is provided between the n-type region 20 and the side portion 23a of the n-well 23. The second separation portion 16 is provided to extend inward of the substrate 10 from the first principal surface S1. The depth of the second separation portion 16 is shallower than that of the n-type region 20, and in the present embodiment, is about 1 μm which is about the half of the depth of the n-type region 20. Note that the depth is not limited to above and may be another value as necessary.

A p-type impurity concentration in the second separation portion 16 is set to about $1 \times 10^{16}$ cm$^{-3}$ to about $1 \times 10^{18}$ cm$^{-3}$. Note that the p-type impurity concentration in the second separation portion 16 is set lower than p-type impurity concentrations in the p-well (the fourth well) 17, a later-described first separation portion 13, a later-described p-well (a first well) 14. The n-type region 20 and the side portion 23a of the n-well 23 are provided with the above-described interval L2 in a direction parallel with the first principal surface S1, such as the X-direction, and the width of the second separation portion 16 is set smaller than the interval L2. That is, a structure is employed, in which the p-epitaxial layer 12, the p-type second separation portion 16, and the p-epitaxial layer 12 are arranged between the n-type region 20 and the side portion 23a of the n-well 23 in the X-direction. Note that although not shown in the figure, even in a case where the APDs 111 are adjacent to each other, the second separation portion 16 is provided between these adjacent APDs 111 and a structure in which the p-epitaxial layer 12, the p-type second separation portion 16, and the p-epitaxial layer 12 are arranged is employed between these APDs 111.

The p-type first separation portion 13 is provided between the light receiving portion 100 and the first circuit block 260 of the readout circuit 220. The first separation portion 13 is provided to extend inward of the substrate 10 from the first principal surface S1, and the depth thereof is deeper than those of the second separation portion 16 and the p-well (the first well) 14 provided at the first circuit block 260 and shallower than that of the n-well (the third well) 21 provided at the first circuit block 260. In the present embodiment, the depth of the first separation portion 13 is set to about 1.3 μm. Note that the depth is not limited to above and may be another value as necessary.

In the X-direction, the light receiving portion 100 and the first separation portion 13 are provided with an interval of equal to or greater than 1 μm. Similarly, the first separation portion 13 and the n-well 21 of the first circuit block 260 are provided with an interval of equal to or greater than 1 μm. The width of the first separation portion 13 is set to equal to or greater than 0.3 μm. Note that the width is not limited to above and may be another value as necessary.

A structure is employed, in which the p-epitaxial layer 12, the p-type first separation portion 13, and the p-epitaxial layer 12 are arranged between the light receiving portion 100 and the first circuit block 260 of the readout circuit 220 in the X-direction. On the first principal surface 51 side of the p-epitaxial layer 12, a shallow trench isolation (STI) 60 having a predetermined depth such as a depth of 0.3 μm to 0.5 μm is formed. The STI 60 is an element separation layer obtained in such a manner that after the substrate 10 has been dug from the first principal surface 51 to form a groove portion and predetermined treatment has been performed for a surface of the groove portion, the groove portion is filled with a silicon oxide film and planarization is performed by chemical mechanical polishing (CMP). The STI 60 is formed to surround the first separation portion 13, specifically cover a peripheral edge of the first separation portion 13, as viewed from above.

The first circuit block 260 is, for example, a correlated double sampling circuit (hereinafter sometimes referred to as a CDS circuit) configured to remove the noise component of the signal charge generated at the APD 111, and is an analog circuit block. Note that the first circuit block 260 is not limited to above and other circuits such as a gain adjustment circuit may be employed.

The first circuit block 260 has the p-well (the first well) 14 provided to extend inward of the substrate 10 from the first principal surface S1, the n-well (the third well) 21 provided to surround side and bottom portions of the p-well 14, and an n-type MISFET (a first transistor) provided at the p-well 14.

The n-well 21 has the same level of depth as that of the n-well 23 of the pixel circuit portion 112. Moreover, the n-well 21 has different n-type impurity concentrations between a portion (hereinafter sometimes referred to as a side portion 21a of the n-well 21) surrounding the side portion of the p-well 14 and a portion (hereinafter sometimes referred to as a bottom portion 21b of the n-well 21) extending inward of the substrate 10 in contact with the bottom portion of the p-well 14, and the n-type impurity concentration in the side portion 21a of the n-well 21 is higher than the n-type impurity concentration in the bottom portion 21b. With this configuration, occurrence of punch-through among the p-well 14, the n-well 21, and the first separation portion 13 can be reduced.

In the X-direction and the Y-direction, the bottom portion 21b of the n-well 21 is formed to extend outward of the side portion 21a, and the amount L3 of such protrusion is about 0.5 μm to about 0.7 μm. Note that the amount is not limited to above and may be another value as necessary. Note that the method for changing the impurity concentration between the side portion 21a and the bottom portion 21b of the n-well 21 is as in description of the method for forming the n-well 23 of the pixel circuit portion 112.

The p-well 14 has the same level of depth and the same level of p-type impurity concentration as those of the p-well 17 of the pixel circuit portion 112. Note that each of p-type impurity concentrations in the p-well 14 of the first circuit block 260, a p-well 15 of a later-described second circuit block 270, and the p-well 17 of the pixel circuit portion 112 is set higher than a p-type impurity concentration in the first separation portion 13.

The n-type MISFET 30 has at least n-type source and drain 32, 32 provided at the first principal surface S1 and a gate 31 provided between the source and the drain 32, 32 at the first principal surface S1 through a gate insulating layer (not shown in the figure).

On the first principal surface S1 side of the gate 31 and the source and the drain 32, 32 of the n-type MISFET 30, a silicide layer 70 as a conductor layer is formed. The above-described STI 60 is formed at a boundary portion between the p-well 14 and the n-well 21, and the silicide layer 70 is also formed on the first principal surface S1 side of the side portion 21a of the n-well 21 surrounded by the STI 60. The silicide layer 70 is formed in a self-aligned manner by a so-called salicide technique.

The n-well 21 is electrically connected to the first wiring layer 520 through the silicide layer 70 and a first well contact 54. The first wiring layer 520 is electrically connected to the power supply of the predetermined voltage Vdd2, and in the present embodiment, Vdd2 is 3.3 V. Note that Vdd2 is not limited to above and may be another value as necessary. The p-well 14 is electrically connected to a GND potential through a not-shown well contact.

The readout circuit 220 further has the second circuit block 270, and the second circuit block 270 is, for example, a digital circuit block such as a counter of the column ADC provided for each column. Note that the second circuit block 270 is not limited to above and may be other circuits.

The second circuit block 270 has the p-well (the first well) 15, the n-well (the third well) 21, and an n-type MISFET (a first transistor) 33 provided at the p-well 15. The n-type MISFET 33 has at least n-type source and drain 35, 35 provided at the first principal surface S1 and a gate 34 provided between the source and the drain 35, 35 at the first principal surface S1 through a gate insulating layer (not shown in the figure). The n-well 21 of the second circuit block 270 has a depth, an impurity concentration, and a sectional profile similar to those of the n-well 21 of the first circuit block 260. The protrusion amount L3 of the bottom portion 21b is also similar to that of the n-well 21 of the first circuit block 260.

Moreover, the second circuit block 270 has another n-well (a second well) 22 provided inside the n-well (the third well) 21 and a p-type MISFET (a second transistor) 36 provided at the n-well 22. The n-well (the second well) 22 is, in the X-direction, provided at the substrate 10 in contact with the p-well (the first well) 15.

The p-type MISFET 36 has at least p-type source and drain 38, 38 provided at the first principal surface S1 and a gate 37 provided between the source and the drain 38, 38 at the first principal surface S1 through a gate insulating layer (not shown in the figure). On the first principal surface S1 side of the gate 37 and the source and the drain 38, 38 of the p-type MISFET 36, the silicide layer 70 is formed. The STI 60 is formed at a boundary portion between the p-well 15 and the n-well 21, 22.

The n-well 21 is electrically connected to the first wiring layer 520 through the silicide layer 70 and a second well contact 55. The first wiring layer 520 is electrically connected to a power supply of a predetermined voltage Vdd1, and in the present embodiment, Vdd1 is 1.2 V. Note that Vdd1 is not limited to above and may be another value as necessary. The p-well 15 is electrically connected to the GND potential through a not-shown well contact. The n-well 22 has the same potential as that of the n-well 21.

Note that the first circuit block 260 and the second circuit block 270 are different from each other in Vdd1, Vdd2 equivalent to the drive voltage of the transistor. Thus, for optimizing performance of the transistor provided at each block, the p-well 14 of the first circuit block 260 and the p-well 15 of the second circuit block 270 may be different from each other in a depth or an impurity profile, for example. Note that as long as performance required for the p-type MISFET 36 is satisfied, the p-type MISFET 36 may be, instead of the n-well 22, provided on the first principal surface S1 side of the side portion 21a of the n-well 21 at the second circuit block 270.

The above-described first separation portion 13 is provided between the first circuit block 260 and the second circuit block 270. In the X-direction, the first circuit block 260 and the second circuit block 270 are provided with the interval L1. Specifically, the n-well 21 of the first circuit block 260 is provided with an interval of equal to or greater than 1 μm from the first separation portion 13. The first separation portion 13 is provided with an interval of equal to or greater than 1 μm from the n-well 21 of the second circuit block 270. The width of the first separation portion 13 is set to equal to or greater than 0.3 μm. Note that these values are not limited to above and may be other values as necessary.

A structure is employed, in which the p-epitaxial layer 12 the p-type first separation portion 13, and the p-epitaxial layer 12 are arranged between the first circuit block 260 and the second circuit block 270 in the X-direction. On the first principal surface S1 side of the p-epitaxial layer 12, the STI 60 having the predetermined depth is formed. The STI 60 is formed to surround the first separation portion 13, specifically cover the peripheral edge of the first separation portion 13, as viewed from above.

Note that other circuit blocks may be provided inside the readout circuit 220. In this case, each circuit block also has the n-well 21, and the first separation portion 13 is provided between adjacent circuit blocks. The first separation portion 13 and the n-well 21 of the circuit block adjacent thereto are provided with a predetermined interval such as an interval of equal to or greater than 1.0 μm. As viewed from above, the STI 60 is formed to surround the periphery of the first separation portion 13. Moreover, the first separation portion 13 is provided between the readout circuit 220 and the horizontal scanning circuit 230 and between the light receiving portion 100 and the vertical scanning circuit 210 with a predetermined interval from these elements. As viewed from above, the STI 60 is formed to surround the periphery of the first separation portion 13, specifically the peripheral edge of the first separation portion 13.

Note that no silicide layer 70 is formed on the first principal surface S1 side of any first separation portion 13 and such a first separation portion 13 is directly covered with an insulating layer 500 containing silicon oxide as a main component and is formed with no well contact.

As shown in FIG. 2, a plurality of pn junctions is formed inside the substrate 10. Focusing on the inside of the pixel 110, in a case where predetermined negative voltage is applied to the back electrode 300, the interface between the n-type region 20 and the p-epitaxial layer 12 and an interface between the p-well 17 and the n-well 23 are brought into the reverse bias state, and a depletion layer is formed. In this case, an end portion (hereinafter merely referred to as a depletion layer end) of the depletion layer is formed to extend longer on a p-epitaxial layer 12 side with a lower impurity concentration. Note that FIG. 2 shows the depletion layer end formed at each pn junction by a dashed line.

In the light detector 1000 described in the present embodiment, the impurity concentrations of the n-type region 20 and the n-well 23 of the pixel circuit portion 112, the impurity concentrations of the p-epitaxial layer 12 and the second separation portion 16, the interval L2 between the n-type region 20 and the n-well 23, and the width and depth of the second separation portion 16 are properly set, and accordingly, a portion between the n-type region 20 and the n-well 23 is depleted, the potential of such a region is destabilized, and the depletion layer end does not reach the first principal surface S1. With this configuration, the interval between the APD 111 and the pixel circuit portion 112 can be narrowed while these elements are electrically separated from each other. Moreover, the size of the pixel 110 can be decreased.

Focusing on a portion between the first circuit block 260 and the second circuit block 270, the interface between the n-well 21 and the p-epitaxial layer 12 is in the reverse bias state, and therefore, the depletion layer is formed to extend from such an interface. The first separation portion 13 having a higher impurity concentration than those of the p-epitaxial layer 12 and the second separation portion 16 is provided between the first circuit block 260 and the second circuit block 270, and the interval between each circuit block and the first separation portion 13 is set to equal to or greater than the predetermined value. With this configuration, a depletion layer extending from an interface between the n-well 21 of the first circuit block 260 and the p-epitaxial layer 12 and a depletion layer extending from an interface between the n-well 21 of the second circuit block 270 and the p-epitaxial layer 12 are formed not to overlap with each other in the X-direction. In the Z-direction, a depletion layer end of the former and a depletion layer end of the latter reach the first principal surface S1.

The depletion layers are formed as described above, a field intensity between the first circuit block 260 and the second circuit block 270 in the X-direction and the Y-direction can be reduced and the first circuit block 260 and the second circuit block 270 can be reliably electrically separated from each other. With this configuration, even in operation of the APD 111, the first circuit block 260 and the second circuit block 270 can be independently driven. The first circuit block 260 and the second circuit block 270 can be electrically separated from each other without full depletion of a portion therebetween, and therefore, the layout of each block can be freely changed. Moreover, noise between the circuit blocks can be blocked.

A depletion layer similar to that between the first circuit block 260 and the second circuit block 270 is also formed between the light receiving portion 100 and the first circuit block 260. Thus, the light receiving portion 100, specifically the pixel array end 101, and the first circuit block 260 can be reliably electrically separated from each other. Moreover, the light receiving portion 100 and the first circuit block 260 can be electrically separated from each other without full depletion of a portion therebetween, and therefore, the layout of the first circuit block 260 relative to the light receiving portion 100, specifically the pixel array end 101, can be freely changed.

[Structure of Portion Below Pad Electrode]

Figure 3A:
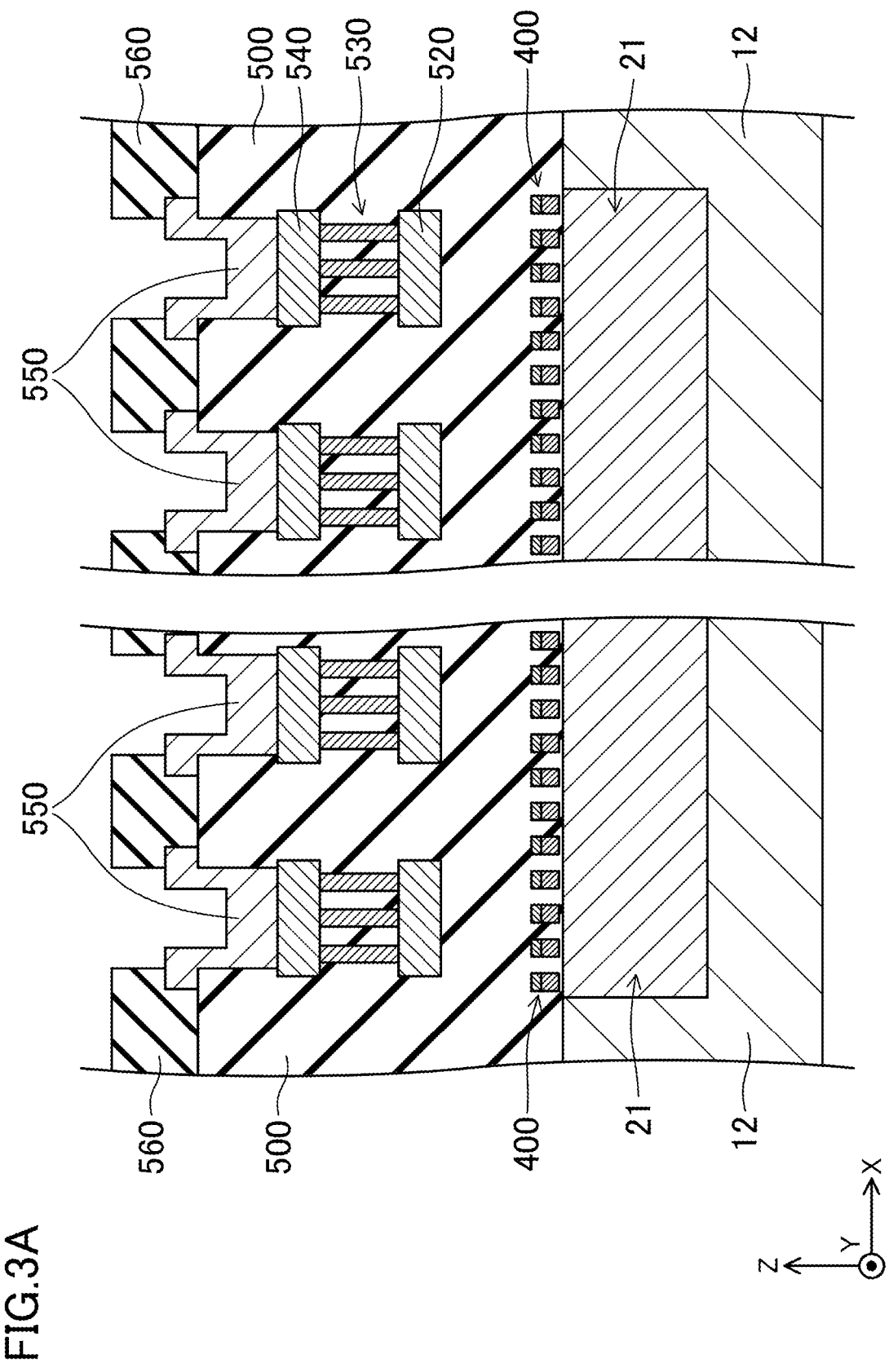
FIG. 3A is a schematic sectional view along an IIIA-IIIA line of FIG. 1.

FIG. 3A shows a schematic sectional view along an IIIA-IIIA line of FIG. 1, FIG. 3B shows a schematic sectional view along an IIIB-IIIB line, and FIG. 3C shows a schematic sectional view along an IIIC-IIIC line. Note that for the sake of convenience in description, the p-type semiconductor layer 11 and the back electrode 300 are not shown in the figure.

In a typical semiconductor device, a chip has been formed with as many dummy gate patterns as possible for effectively reducing uneven gate etching, uneven CMP for planarizing an interlayer insulating layer, and a proximity effect in lithography.

With miniaturization of a transistor, the thickness of the interlayer insulating layer has been decreased in the typical semiconductor device. However, in this case, an interval between a wiring layer positioned on the lower side of a pad electrode and the dummy gate pattern is narrowed, and the potential of the dummy pattern become unstable when current flows in the wiring layer. Depending on conditions, there is a probability that short-circuit between the dummy gate pattern and a substrate is caused due to damage of a gate insulating layer (not shown in the figure) right below the dummy pattern. Moreover, there is also a probability that the interlayer insulating layer between the wire and the dummy gate pattern is damaged.

For these reasons, in the present embodiment, as shown in FIGS. 3A to 3C, the n-well 21 is continuously formed on the first principal surface 51 side of the substrate 10 positioned on the lower side of the pad electrodes 550, and the n-well 21 is electrically connected to the power supply of the voltage Vdd2 such that the potential thereof is fixed. With this configuration, the potential of a dummy gate pattern (hereinafter referred to as a dummy gate 400) can be stabilized, and, e.g., short-circuit between such a pattern and the substrate 10 can be prevented. Moreover, the dummy gates 400 are provided at predetermined pitches on the lower side of the pad electrodes 550, and therefore, uneven gate etching, an uneven thickness of the interlayer insulating layer after CMP, and the proximity effect in lithography can be reduced.

Note that FIGS. 3A to 3C show a structure in which the first and second wiring layers 520, 540, a well contact array 510 electrically connecting the first wiring layer 520 and the silicide layer 70 to each other, and a via array 530 electrically connecting the first wiring layer 520 and the second wiring layer 540 to each other are provided among the pad electrodes 550 and the dummy gates 400, but the present disclosure is not limited to above and three or more wiring layers may be provided. Moreover, a passivation film 560 covering a peripheral edge of the pad electrode 550 is preferably a film containing a silicon nitride film as a main component, but may be made of a material such as a silicon oxide film. Entrance of moisture into the light detector 1000 can be reduced, and mechanical protection of the light detector 1000 can be provided. The passivation film 560 more preferably has a multilayer structure (not shown in the figure) of a first film containing a silicon nitride film as a main component and a second film containing polyimide as a main component, but the first film may be made of a material such as a silicon oxide film.

Advantageous Effects Etc.

As described above, the light detector 1000 according to the present embodiment is the light detector 1000 configured such that the light receiving portion 100 having the plurality of APDs 111 arranged in a matrix at the predetermined intervals and the peripheral circuit portion 200 configured to exchange a signal with the light receiving portion 100 are provided on the first principal surface 51 of the p-type substrate 10.

The light detector 1000 includes at least the back electrode 300 provided on the second principal surface S2 of the substrate 10 facing the first principal surface S1 and configured to apply the predetermined voltage to the substrate 10 and the p-type first separation portion 13 provided between the light receiving portion 100 and the peripheral circuit portion 200 with the predetermined interval from the light receiving portion 100 and the peripheral circuit portion 200 in the X-direction.

The APD 111 has at least the n-type region (the first region) 20 provided to extend inward of the substrate 10 from the first principal surface S1 and the p-epitaxial layer (the second region) 12 provided in contact with the n-type region 20 in the Z-direction.

The peripheral circuit portion 200 has at least the p-well (the first well) 14 provided to extend inward of the substrate 10 from the first principal surface S1, the n-type MISFET (the first transistor) 30 provided at the p-well 14, and the n-well (the third well) 21 provide to surround the side and bottom portions of the p-well 14.

With this configuration of the light detector 1000, in a case where the predetermined voltage is applied to the back electrode 300 and the APDs 111 are operated, a field intensity between the light receiving portion 100 and the peripheral circuit portion 200 in the direction parallel with the first principal surface S1 can be reduced, and the light receiving portion 100 and the peripheral circuit portion 200 can be reliably electrically separated from each other. Moreover, the light receiving portion 100 and the peripheral circuit portion 200 can be electrically separated from each other without full depletion of a portion therebetween, and therefore, the layout of the peripheral circuit portion 200 relative to the light receiving portion 100 can be freely changed.

The peripheral circuit portion 200 includes the plurality of circuit blocks, and the first separation portion 13 is provided between the circuit blocks adjacent to each other in the direction parallel with the first principal surface S1 with the predetermined interval from each circuit block. At least one of the plurality of circuit blocks has at least the p-well (the first well) 15, the n-type MISFET (the first transistor) 33, and the n-well (the third well) 21.

With this configuration of the peripheral circuit portion 200, in a case where the APDs 111 are operated, the field intensity between adjacent circuit blocks can be reduced, and these circuit blocks can be reliably electrically separated from each other. Moreover, adjacent circuit blocks can be electrically separated from each other without full depletion of a portion therebetween, and therefore, the layout of each circuit block can be freely changed.

At least two of the plurality of circuit blocks may be driven by application of different voltages. In a case where, e.g., the sizes of the transistors provided at the circuit blocks are different from each other, the drive voltages are properly set so that each circuit block can be accurately operated.

The plurality of circuit blocks may include a digital circuit block formed with a digital circuit and an analog circuit block formed with an analog circuit.

As viewed from above, the STI 60 is formed between the light receiving portion 100 and the n-well (the third well) 21 of the peripheral circuit portion 200 and between the n-wells (the third wells) 21 of adjacent circuit blocks to surround the first separation portion 13, specifically cover the peripheral edge of the first separation portion 13.

With this configuration, in a case where the APDs 111 are operated, even if the depletion layer end reaches the first principal surface S1 of the substrate 10, the flow of leakage current along the first principal surface S1 can be reduced.

As viewed in the section, the bottom portion 21b of the n-well (the third well) 21 is preferably provided to extend outward of the side portion 21a of the n-well (the third well) 21.

With this configuration, a field intensity at a peripheral edge portion of the n-well 21 in the substrate 10 can be reduced, and the light receiving portion 100 and the peripheral circuit portion 200 or adjacent circuit blocks can be reliably electrically separated from each other. Note that the protrusion amount L3 of the bottom portion 21b with respect to the side portion 21a of the n-well 21 may be changed as necessary according to, e.g., the size of the peripheral circuit portion 200 or the degree of separation between adjacent circuit blocks.

Of the circuit blocks having the p-wells (the first wells) 15, the n-type MISFETs (the first transistors) 33, and the n-wells (the third wells) 21, at least one circuit block has the n-well (the second well) 22 provided inside the n-well (the third well) 21 in contact with the p-well (the first well) 15 in the direction parallel with the first principal surface S1 and the p-type MISFET (the second transistor) 36 provided at the n-well (the second well) 22.

With this configuration, a circuit block including a CMOS circuit can be arranged in the light detector 1000.

The potentials of the p-wells (the first wells) 14, 15 are fixed to the GND potential (a first potential), and the potential of the n-well (the third well) 21 is fixed to the potential (a second potential) different from the GND potential, such as Vdd1 (=1.2 V) or Vdd2 (=3.3 V). Moreover, the potential of the n-well (the second well) 22 and the potential of the n-well (the third well) 21 are the same potential.

With this configuration, the n-type MISFETs (the first transistors) 30, 33 and the p-type MISFET (the second transistor) 36 each formed at the p-wells (the first wells) 14, 15 and the n-well (the second well) 22 can be accurately operated.

The substrate 10 includes at least the p-type semiconductor layer (the first semiconductor layer) 11 and the p-epitaxial layer (the second semiconductor layer) 12 provided on the first principal surface S1 side of the p-type semiconductor layer 11, and the p-type impurity concentration in the p-epitaxial layer 12 is lower than the p-type impurity concentration in the p-type semiconductor layer 11.

With this configuration, the p-type semiconductor layer 11 and the back electrode 300 are in electric contact (ohmic contact) with each other, and holes generated in the p-epitaxial layer 12 by photoelectric conversion move to the multiplication region AM by drift without great scattering of the holes. Accordingly, the multiplication factor of electrons generated in the multiplication region AM is enhanced.

The light receiving portion 100 further has the pixel circuit portions 112 each provided with the predetermined interval from the APDs 111 in the X-direction. The pixel circuit portion 112 at least has the p-well (the fourth well) 17 provided to extend inward of the substrate 10 from the first principal surface S1, the n-type MISFET (the third transistor) 40 provided at the p-well 17, and the n-well (the fifth well) 23 provided to surround the side and bottom portions of the p-well 17.

With this configuration of the light receiving portion 100, the output signal of the APD 111 can be transferred to the outside such as the readout circuit 220.

The p-type second separation portion 16 is further provided between the APD 111 and the pixel circuit portion 112 adjacent to each other with the predetermined interval from each of the APD 111 and the pixel circuit portion 112 in the X-direction.

The p-type impurity concentration in the second separation portion 16 is set lower than the p-type impurity concentration in the first separation portion 13.

With the second separation portion 16 provided as described above, the n-type region of the APD 111 and the n-well 23 of the pixel circuit portion 112 are depleted. Accordingly, the APD 111 and the pixel circuit portion 112 can be electrically separated from each other while the interval therebetween is narrowed. Moreover, the size of the pixel 110 can be decreased.

No STI 60 is formed between the APD 111 and the pixel circuit portion 112 adjacent to each other.

Generally, stress is likely to be caused at an interface between the STI 60 and the substrate 10, and if the STI 60 is provided between the APD 111 and the pixel circuit portion 112, leakage current might flow due to such stress. Particularly, when the size of the pixel 110 is decreased while the area of the APD 111 is held in the light receiving portion 100, the interval between the APD 111 and the pixel circuit portion 112 is narrowed, and the width of the STI 60 is narrowed accordingly. Meanwhile, when the width is narrowed as described above, the stress at a corner portion of a bottom portion of the STI 60 increases, and the leakage current is likely to be caused between the APD 111 and the pixel circuit portion 112. There is a probability that the output signal of the APD 111 is erroneously detected due to mixing of such leakage current with the signal charge.

On the other hand, according to the present embodiment, the second separation portion 16 is provided between the APD 111 and the pixel circuit portion 112 adjacent to each other, and on the other hand, no STI 60 is formed therebetween. Thus, the leakage current due to the stress etc. can be reduced, and the APD 111 and the pixel circuit portion 112 can be reliably separated from each other.

The potential of the p-well (the fourth well) 17 is fixed to the same GND potential as those of the p-wells (the first wells) 14, 15, and on the other hand, the potential of the n-well (the fifth well) 23 is fixed to Vdd2 (=3.3 V).

With this configuration, the n-type MISFET (the third transistor) 40 can be accurately operated, and the signal charge of the APD 111 can be transferred to the readout circuit 220.

The insulating layer 500 is provided on the first principal surface S1 to cover the light receiving portion 100 and the peripheral circuit portion 200. The n-type MISFET (the first transistor) 30 has at least the n-type source and drain 32, 32 provided at the first principal surface S1 and the gate 31 provided between the source and the drain 32, 32 at the first principal surface S1 through the not-shown gate insulating layer. On the source and the drain 32, 32 and the first principal surface S1 side of the gate 31, the conductor layer containing metal, the silicide layer 70 in this case, is formed. On the other hand, on the first principal surface S1 side of the first separation portion 13, no silicide layer 70 is formed.

With this configuration, the electric resistance of the n-type MISFET 30 can be reduced for performance enhancement. Moreover, no silicide layer 70 is formed on the first separation portion 13, and therefore, a leakage current increase between the light receiving portion 100 and the peripheral circuit portion 200 or between adjacent circuit blocks can be suppressed.

<First Variation>

Figure 4:
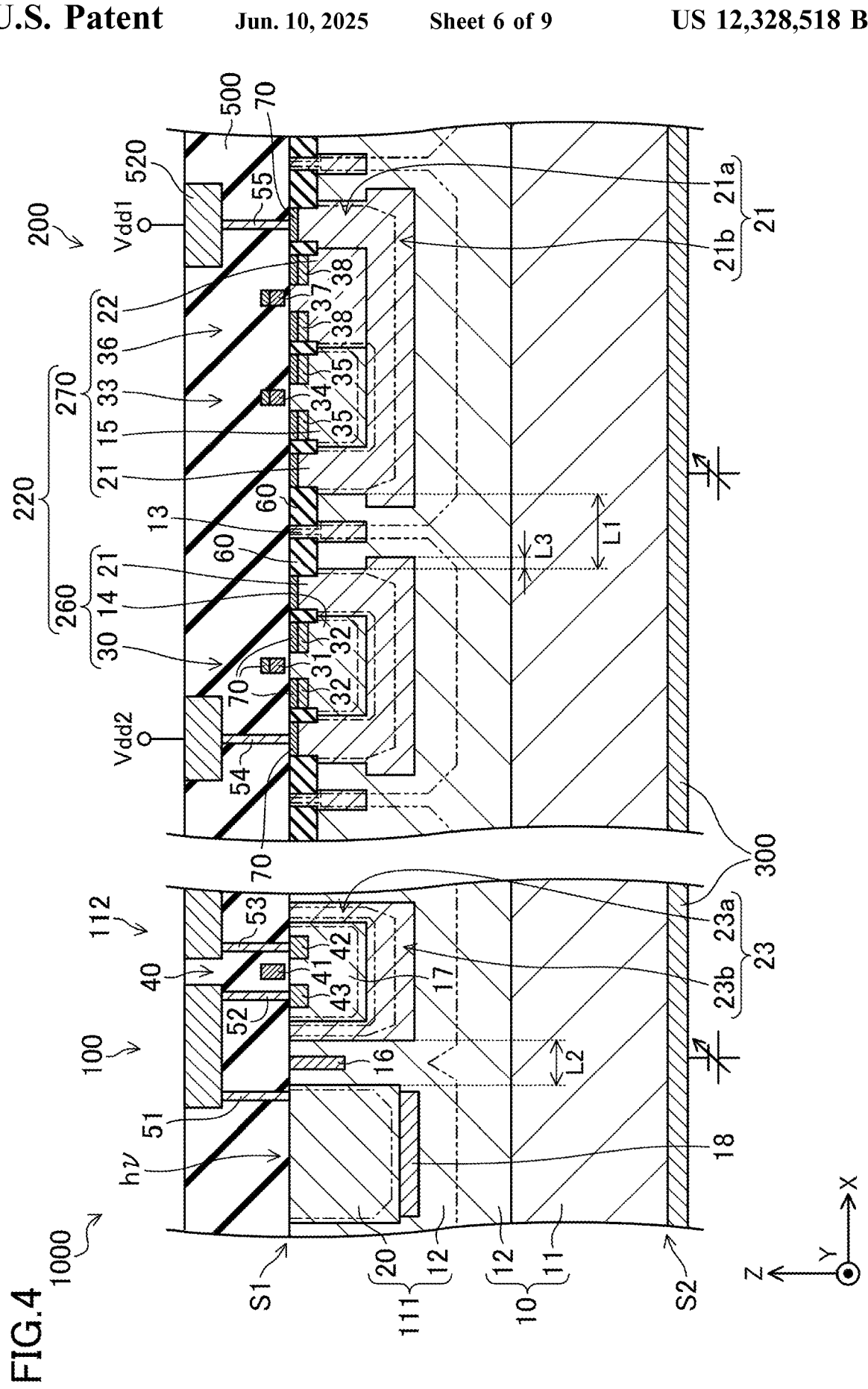
FIG. 4 is a schematic sectional view of a light detector according to a first variation.

FIG. 4 shows a schematic sectional view of a light detector according to the present variation. Note that the same reference numerals are used to represent elements similar to those of the embodiment in FIG. 4 and subsequently-shown FIGS. 5 to 7 and description thereof will be omitted.

A configuration described in the present variation is different from the configuration described in the embodiment in that a p-type region (a second region) 18 is provided right below the n-type region 20. The p-type region 18 is provided inside the p-epitaxial layer 12, and a p-type impurity concentration in the p-type region 18 is set higher than the p-type impurity concentration of the p-epitaxial layer 12.

With this configuration, the field intensity in the multiplication region AM increases, and therefore, an avalanche breakdown voltage can be reduced. Accordingly, the circuit configuration of the light detector 1000 can be simplified.

<Second Variation>

Figure 5:
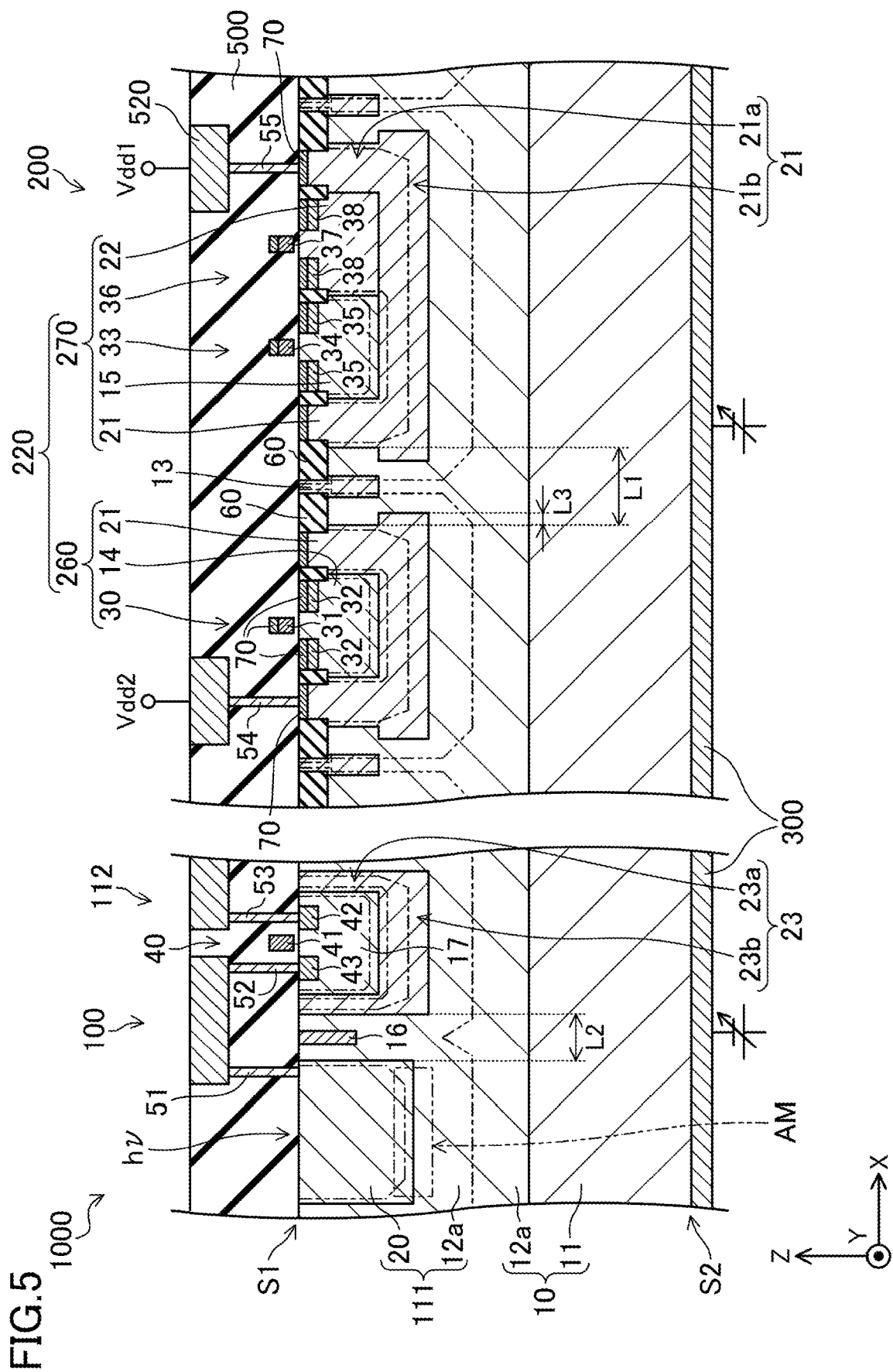
FIG. 5 is a schematic sectional view of a light detector according to a second variation.

FIG. 5 shows a schematic sectional view of a light detector according to the present variation, and a configuration described in the present variation is different from the configuration described in the embodiment on the following points.

A p-epitaxial layer 12a has the gradient of the impurity concentration in the Z-direction. Specifically, the p-type impurity concentration of the p-epitaxial layer 12a decreases from the second principal surface S2 to the first principal surface 51, and a portion of the p-epitaxial layer 12a close to the first principal surface S1, i.e., a portion (a second region) where the p-type impurity concentration is low, contacts the n-type region 20 to form a pn junction. Moreover, in the present variation, a region including a joint surface between the second region and the n-type region 20 is the multiplication region AM, and the p-type impurity concentration in the p-epitaxial layer 12a is adjusted such that avalanche multiplication occurs in such a region.

As described above, electrons generated by photoelectric conversion in the p-epitaxial layer 12 are drifted to the multiplication region AM due to the built-in potential of the pn junction formed by the n-type region 20 and the p-epitaxial layer 12, and are avalanche-multiplied in the multiplication region AM.

As in the present variation, the gradient of the p-type impurity concentration is provided in the p-epitaxial layer 12a, and therefore, electrons generated at a location deep in the substrate 10 by photoelectric conversion are also easily drifted to the multiplication region AM. Accordingly, the multiplication factor of the electrons can be further enhanced. Moreover, holes can be easily discharged to the outside of the substrate 10.

Due to an electric field generated in the Z-direction inside the p-epitaxial layer 12a, hole movement in the X-direction or the Y-direction can be reduced, and the sensitivity of the light detector 1000 can be enhanced. Moreover, inflow of holes from an adjacent APD 111 can be reduced, and the mixed color of the light detector 1000 can be reduced.

<Third Variation>

Figure 6:
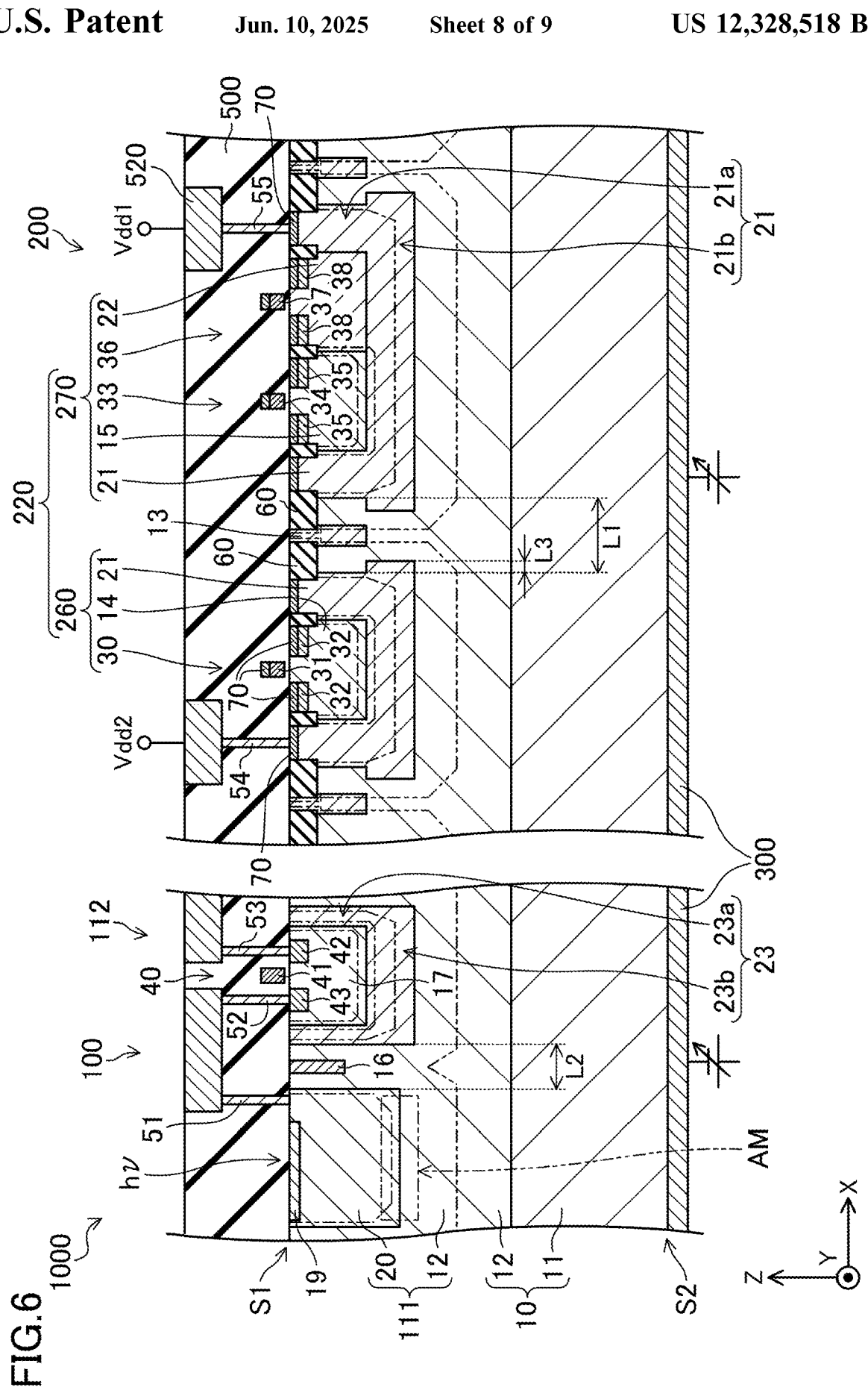
FIG. 6 is a schematic sectional view of a light detector according to a third variation.

FIG. 6 shows a schematic sectional view of a light detector according to the present variation, and a configuration described in the present variation is different from the configuration described in the embodiment in that a p+ region 19 is provided on the first principal surface S1 side of the n-type region 20.

The p-type impurity concentration of the p+ region 19 is, for example, set to $1×10^{18}$ cm$^{-3}$ to $1×10^{20}$ cm$^{-3}$. Note that the concentration is not limited to above and may be another value as necessary. Note that the p-type impurity concentration of the p+ region 19 is set higher than the p-type impurity concentrations of the second separation portion 16 and the p-well (the fourth well) 17. Moreover, the p+ region 19 is fixed to a predetermined potential such as the GND potential through a not-shown contact.

At an interface between the substrate 10 and the insulating layer 500, i.e., the first principal surface S1 of the substrate 10, a dangling bond which is an unbonded hand of a silicon atom is present to form a surface level.

With a high density of the surface level, electrons are generated from the surface level, and as a noise component, are superimposed on the output signal of the APD 111.

On the other hand, according to the present variation, the p+ region 19 is provided on the first principal surface S1 side of the n-type region 20, and therefore, the electrons generated at the surface level can be rejoined to holes inside the p+ region 19 and be annihilated. Accordingly, the noise component contained in the output signal of the APD 111 can be significantly reduced, and the sensitivity of the light detector 1000 can be enhanced.

<Fourth Variation>

Figure 7:
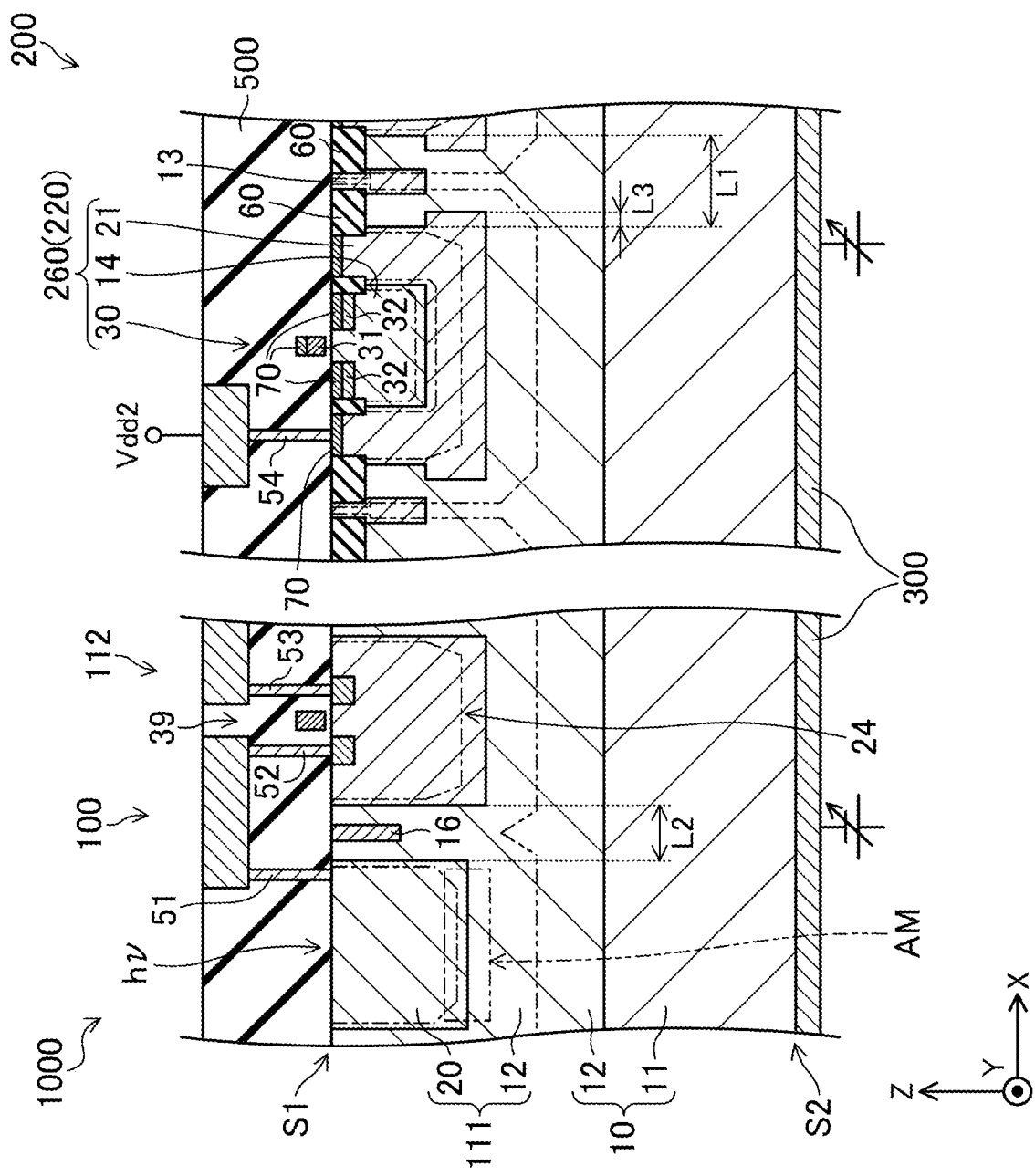
FIG. 7 is a schematic sectional view of a light detector according to a fourth variation.

FIG. 7 shows a schematic sectional view of a light detector according to the present variation, and a configuration described in the present variation is different from the configuration described in the first embodiment in that the pixel circuit portion 112 includes a p-type MISFET (a second transistor) 39 formed at an n-well (a fourth well) 24. Of the readout circuit 220 of the peripheral circuit portion 200, the second circuit block 270 is omitted.

That is, the light detector 1000 according to the present variation is the light detector 1000 configured such that the light detector 1000 having the plurality of APDs 111 arranged in a matrix at the predetermined intervals and the peripheral circuit portion 200 configured to exchange a signal with the light receiving portion 100 are provided on the first principal surface S1 of the p-type semiconductor substrate 10.

The light detector 1000 includes at least the back electrode 300 provided on the first principal surface S1 of the substrate 10 facing the first principal surface S1 and configured to apply the predetermined voltage to the substrate 10 and the p-type first separation portion 13 provided with the predetermined interval from each of the light receiving portion 100 and the peripheral circuit portion 200 in the X-direction.

The APD 111 has at least the n-type region (the first region) 20 provided to extend inward of the substrate 10 from the first principal surface S1 and the p-epitaxial layer (the second region) 12 provided in contact with the n-type region 20 in the Z-direction.

The peripheral circuit portion 200 has at least the p-well (the first well) 14 provided to extend inward of the substrate 10 from the first principal surface S1, the n-type MISFET (the first transistor) 30 provided at the p-well 14, and the n-well (the third well) 21 provided to surround the side and bottom portions of the p-well 14.

The light receiving portion 100 further has the pixel circuit portions 112 provided with the predetermined interval from the APDs 111 in the X-direction. The pixel circuit portion 112 has at least the n-well (the fourth well) 24 and the p-type MISFET (the second transistor) 39 provided at the n-well 24. The p-type second separation portion 16 is further provided between the APD 111 and the pixel circuit portion 112 adjacent to each other with the predetermined interval from each of the APD 111 and the pixel circuit portion 112 in the X-direction.

With this configuration of the light detector 1000, advantageous effects similar to those provided by the configuration described in the first embodiment can be provided. That is, the light receiving portion 100 and the peripheral circuit portion 200 can be electrically separated from each other without full depletion of a portion therebetween, and therefore, the layout of the peripheral circuit portion 200 relative to the light receiving portion 100 can be freely changed.

The APD 111 and the pixel circuit portion 112 can be electrically separated from each other while the interval therebetween is narrowed. Moreover, the size of the pixel 110 can be decreased.

Note that in FIG. 7, the transistor provided at the first circuit block 260 of the peripheral circuit portion 200 is the n-type MISFET 30, but may be a p-type MISFET. In this case, the p-well 14 is omitted. Moreover, as shown in FIG. 2, the second circuit block 270 may be provided at the readout circuit 220.

Other Embodiments

Note that the components described in the embodiments including the first to fourth variations can be combined as necessary to form a new embodiment. For example, the p+ region 19 described in the third variation may be applied to the configuration described in the first variation.

The first circuit block 260 and the second circuit block 270 may switch arrangement positions with each other. A plurality of circuit blocks may be provided at a circuit other than the readout circuit 220. Moreover, the peripheral circuit portion 200 may include not only a so-called MOS circuit but also an analog circuit block including a bipolar transistor. A so-called BiCMOS circuit including a bipolar transistor and a CMOS may be included. It may only be required that the first separation portion 13 is provided between adjacent circuit blocks with the predetermined interval from each of these circuit blocks and the STI 60 is provided to surround the first separation portion 13 as viewed from above.

Note that in FIGS. 2 and 4 to 7, the STI 60 is provided to surround the first separation portion 13 to cover the peripheral edge of the first separation portion 13, but the STI 60 may be provided to cover the entirety of the first separation portion 13 as viewed from above. For example, in a case where the width of the first separation portion 13 in the X-direction is close to the minimum machining dimension of the STI 60, the STI 60 is provided to cover the entirety of the first separation portion 13 and surround the first separation portion 13 as viewed from above. That is, in the embodiments including each variation, it may only be required that the STI 60 is provided to surround the first separation portion 13 to cover at least the peripheral edge of the first separation portion 13 as viewed from above.

In each variation and each embodiment, the light detector 1000 configured such that the APDs 111 are arranged in a matrix has been described by way of example, but may include only one APD 111.

The first separation portion 13 may be provided between the APD 111 and the pixel circuit portion 112. In this case, the pixel circuit portion 112 corresponds to part of the peripheral circuit portion 200, and the degree of freedom in the layout of the pixel circuit portion 112 is improved. For example, such a configuration may be applied to a light detector 1000 as a line sensor provided only with one row or column of APDs 111.

Note that in the embodiments including each variation, a so-called front surface illumination (FSI) type light detector has been described by way of example, but the arrangement relationship between the light receiving portion 100 and the peripheral circuit portion 200 in the present disclosure and the circuit blocks included in the peripheral circuit portion 200, particularly the arrangement relationship between the first separation portion 13 and the n-well 21, can be also applied to a back surface illumination (BSI) type light detector. In this case, instead of providing the back electrode 300, a transparent electrode (not shown in the figure) is provided on a light receiving surface (the first principal surface S1) of each APD 111.

In the embodiments including the first to third variations, the APD 111 and the n-type MISFET 40 for reading the signal charge generated at the APD 111 have been described as the elements included in the pixel circuit portion 112, but an element etc. other than above may be included. For example, the drain 43 of the n-type MISFET 40 may be a floating diffusion, and a reset transistor (not shown in the figure) and a source follower transistor (not shown in the figure) connected to the floating diffusion may be provided. Moreover, a selection transistor (not shown in the figure) connected in series with the source follower transistor may be provided, and may be turned on to read the signal charge to the not-shown vertical signal line. Similarly, in the fourth variation, a reset transistor (not shown in the figure) and a source follower transistor (not shown) may be provided at the pixel circuit portion 112. Moreover, a selection transistor (not shown in the figure) connected in series with the source follower transistor may be provided.

In the specification of the present application, the substrate 10 may be of an n-type, and the region (equivalent to the n-type region 20 of FIG. 2) of the APD 111 where the charge is accumulated may be of a p-type. Accordingly, the first and second separation portions 13, 16 are of an n-type, and the conductive type of each well and the conductive type of the transistor are opposite to those described in the embodiments and each variation.

The light detector of the present disclosure is useful for application to a light detector configured so that the degree of freedom in the layout of a peripheral circuit portion can be enhanced and light detection can be performed with a high sensitivity.

What is claimed is:

1. A light detector in which a light receiving portion and a peripheral portion are provided on a semiconductor substrate, wherein:
the light receiving portion includes:
an n-type first region;
a p-type second semiconductor layer; and
a p-type first semiconductor layer,
the first region, the second semiconductor layer, and the first semiconductor layer are stacked in this order,
a maximum p-type impurity concentration in the first semiconductor layer is higher than a maximum p-type impurity concentration in the second semiconductor layer,
the peripheral portion includes:
a p-type first well;
an n-type third well;
an n-type fourth well;
an isolation; and
the first semiconductor layer,
the isolation contacts side portions of the third well and the fourth well, and
the third well surrounds at least one side portion and a bottom portion of the first well as viewed in a cross section.

2. The light detector according to claim 1, wherein
the semiconductor substrate has a first principal surface and a second principal surface opposite to the first principal surface,
the first region is stacked on a first principal surface side,
the first semiconductor layer is stacked on a second principal surface side,
the first semiconductor layer is in contact with the second principal surface in the peripheral portion, and
an impurity concentration on the second principal surface side in the first semiconductor layer is higher than an impurity concentration in the second semiconductor layer.

3. The light detector according to claim 1, wherein
the peripheral portion has the second semiconductor layer, and
the second semiconductor layer is in contact with both a side portion of the third well and the first semiconductor layer.

4. The light detector according to claim 1, wherein
the peripheral portion has a plurality of circuit blocks and has the second semiconductor layer between the plurality of circuit blocks, and
the second semiconductor layer is in contact with the first semiconductor layer.

5. The light detector according to claim 4, wherein
a thickness of the third well is larger than a thickness of the first region as viewed in the cross section.

6. The light detector according to claim 5, wherein
the light receiving portion has one or more avalanche photodiodes.

7. The light detector according to claim 6, wherein
the third well surrounds both side portions of the first well and the bottom portion of the first well as viewed in the cross section.

8. A light detector in which a light receiving portion and a peripheral portion are provided on a semiconductor substrate, wherein:
the light receiving portion includes:
an n-type first region;
a p-type second semiconductor layer; and
a p-type first semiconductor layer,
the first region, the second semiconductor layer, and the first semiconductor layer are stacked in this order,
a maximum p-type impurity concentration in the first semiconductor layer is higher than a maximum p-type impurity concentration in the second semiconductor layer,
the peripheral portion includes:
a p-type first well;
an n-type third well;
an n-type fourth well;
an isolation; and
the first semiconductor layer,
the isolation contacts side portions of the third well and the fourth well, and the third well surrounds side and bottom portions of the first well as viewed in a cross section, and a side end of the third well extends longer toward a first principal surface of the semiconductor substrate than a side end of the first well as viewed in the cross section.

9. A light detector in which a light receiving portion and a peripheral portion are provided on a semiconductor substrate, wherein:
the light receiving portion includes:
an n-type first region;
a p-type second semiconductor layer; and
a p-type first semiconductor layer,
the first region, the second semiconductor layer, and the first semiconductor layer are stacked in this order,
a maximum p-type impurity concentration in the first semiconductor layer is higher than a maximum p-type impurity concentration in the second semiconductor layer,
the peripheral portion includes:
a p-type first well;
an n-type third well; and
the first semiconductor layer, and
the third well surrounds side and bottom portions of the first well as viewed in a cross section, and the side and bottom portions have different impurity concentrations from each other.

10. The light detector according to claim 1, wherein the third well in the peripheral portion surrounds an entirety of the one side portion and an entirety of the bottom portion of the first well as viewed in the cross section.

11. The light detector according to claim 6, wherein:
the third well covers at least the one side portion and the bottom portion of the first well, and
a p-type layer surrounds side and bottom portions of the third well as viewed in the cross section.

* * * * *